United States Patent [19]

Mehalal

[11] Patent Number: 5,517,452
[45] Date of Patent: May 14, 1996

[54] METHOD AND APPARATUS FOR COMPENSATING FOR SUBTHRESHOLD CURRENT IN A STATIC RAM

[75] Inventor: Moti Mehalal, Haifa, Israel

[73] Assignee: Intel Corporation, Santa Clara, Calif.

[21] Appl. No.: 403,407

[22] Filed: Mar. 14, 1995

[51] Int. Cl.⁶ ............................................... G11C 7/00
[52] U.S. Cl. ................. 365/203; 365/189.11; 365/190; 365/204
[58] Field of Search .......................... 365/203, 204, 365/189.11, 190

[56] References Cited

U.S. PATENT DOCUMENTS 4,905,197  2/1990  Urai ................................ 365/204
5,200,924  4/1993  Wong ............................... 365/208
5,412,606  5/1995  Lee .................................. 365/203
5,416,742  5/1995  Takada ............................. 365/203

Primary Examiner—David C. Nelms
Assistant Examiner—Son Dinh
Attorney, Agent, or Firm—Blakely, Sokoloff, Taylor & Zafman

[57] ABSTRACT

A discharging circuit for bit lines for compensating for the effect of subthreshold leakage in pull-up transistors. The bit lines are periodically discharged to a level approximately equal to the level that the bit lines would be at if no leakage occurred. In this way, the discharging can occur even during an active memory cycle. The discharging occurs infrequently, for example, once every 512 memory cycles.

6 Claims, 2 Drawing Sheets

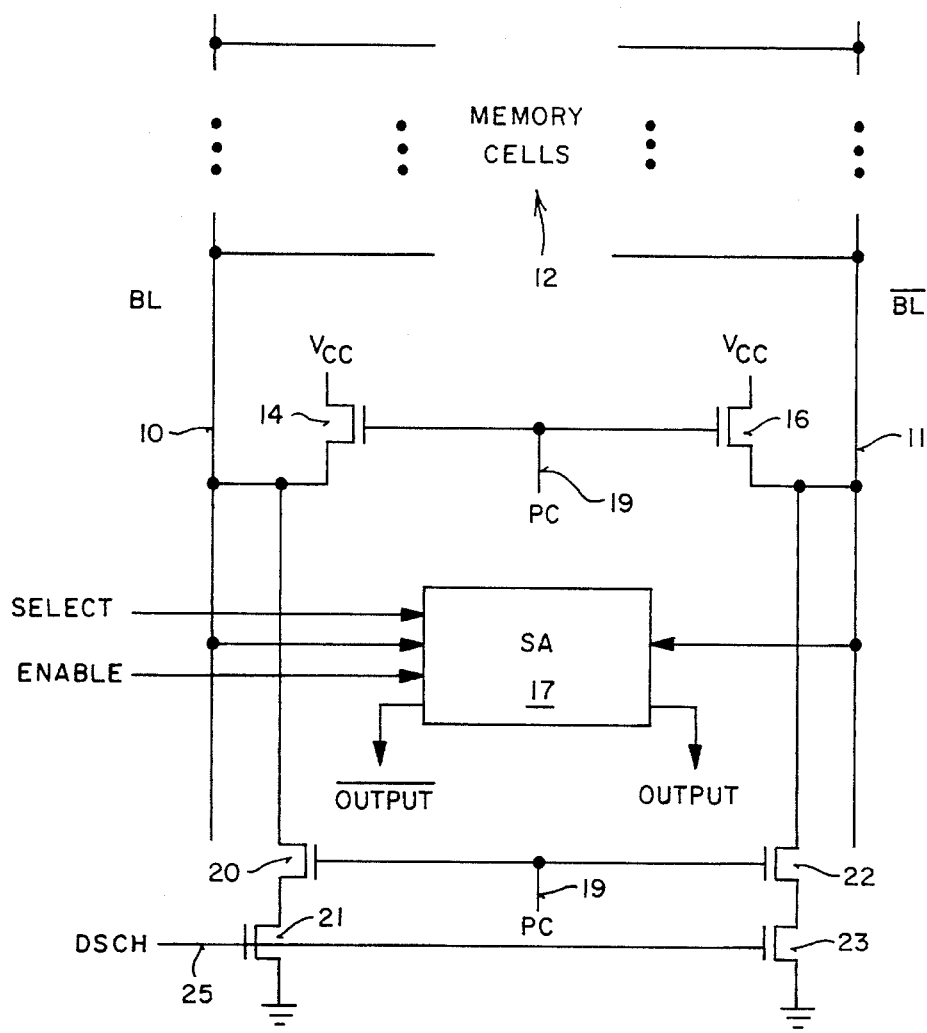
FIG_1
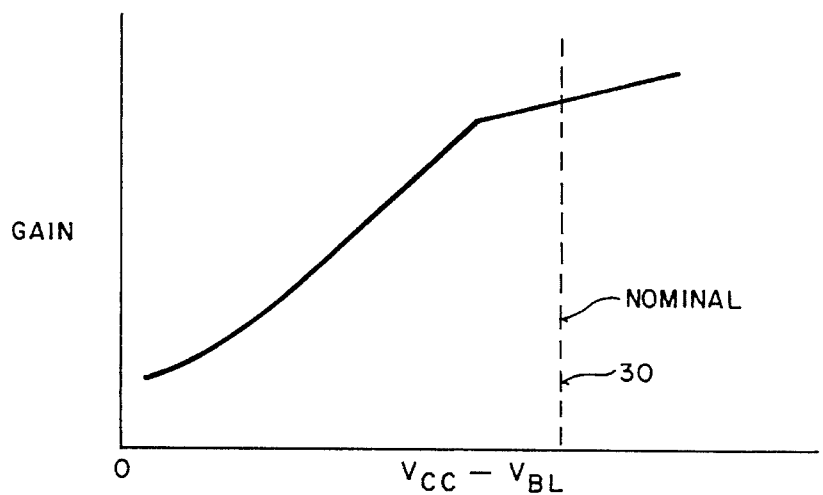
FIG_2

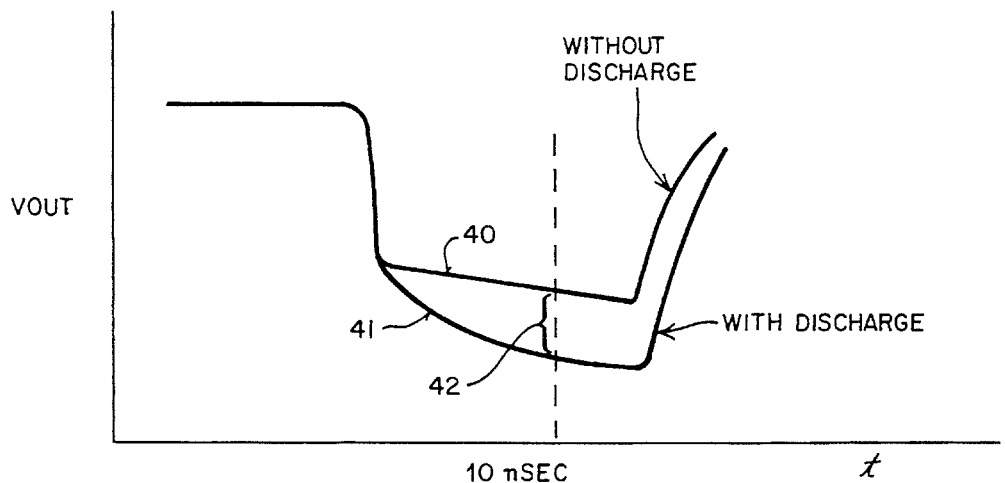
FIG_3
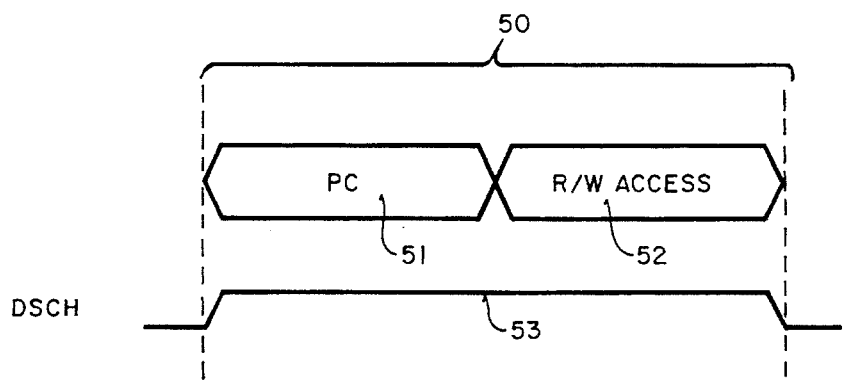
FIG_4
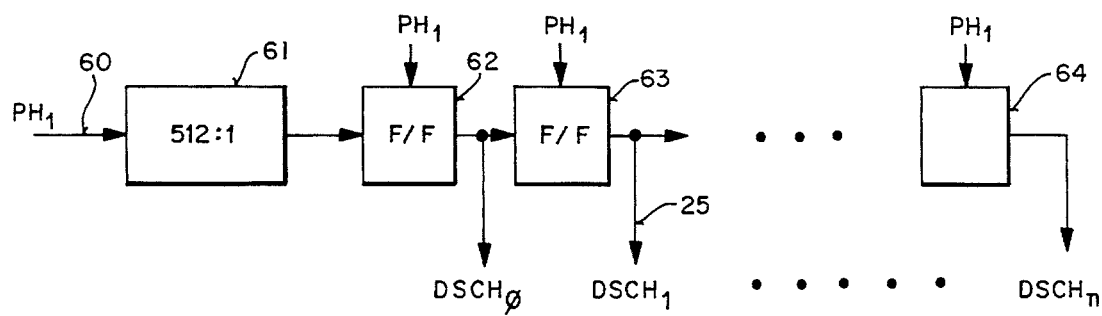
FIG_5

METHOD AND APPARATUS FOR COMPENSATING FOR SUBTHRESHOLD CURRENT IN A STATIC RAM

BACKGROUND OF THE INVENTION

1. Field of the Invention

The invention relates to the field of semiconductor memories and in particular to precharged lines in memories such as precharged bit lines.

2. Prior Art

In memory arrays, bit lines are typically used to interconnect memory cells with sense amplifiers. To speed up sensing of data coupled over the bit lines, the bit lines are often precharged to a predetermined potential. This enables, among other things, for the sense amplifiers to be optimized for a narrow dynamic range and thereby provide greater sensitivity.

The bit lines must be charged before, for example, a read cycle can occur. To speed up operation in memories, the bit lines are kept charged during inactive memory cycles. These bit lines may remain charged for considerable lengths of time because cells are not always frequently accessed. This is true for instance, in a cache memory as well as other static memories. Thus, the "pull-up" transistors used to precharge the bit lines may remain in a conductive state for relatively long periods.

When n-type pull-up transistors are used, they may exhibit leakage while conducting (subthreshold leakage) that will raise the potential of the bit line above its ideal precharged (nominal) potential. In this case, the nominal potential on the bit line will be $V_{cc}$ less the voltage threshold drop of the pull-up transistor if there is no leakage. If the transistor exhibits subthreshold leakage, then the bit line may be charged to a higher level than the nominal.

The commonly used current-mirror sense amplifier is optimized to operate at a potential of $V_{cc}$ less the threshold drop associated with the pull-up transistor, a higher potential on the bit line will deteriorate the performance of the sense amplifier. This can result in slower sensing or even failure in a self-timed system as will be discussed in the Detailed Description of the Invention.

A memory may be tested to determine if any of its pull-up transistors exhibit subthreshold leakage. This testing, however, takes a relatively long time and consequently is undesirable.

Other approaches to dealing with subthreshold leakage are described in co-pending U.S. application Ser. No. 340, 246, entitled "Bit Line Level Insensitive Sense Amplifier", filed on Nov. 16, 1994 and U.S. Ser. No. 271,865, entitled "Apparatus and Method for Adjusting and Maintaining a Bit Line Precharge Level", filed on Jul. 7, 1994; both these applications are assigned to the Assignee of the present application.

SUMMARY OF THE INVENTION

A method for use in a memory having a bit line which is precharged through an n-channel transistor for reducing the effects of subthreshold conduction through the n-channel transistor is disclosed. The bit line is periodically selected for discharging. The discharge is controlled (limited) so that access to a memory cell connected to the bit line can occur after the bit line is selected for discharging without a new precharge cycle occurring.

In the currently preferred embodiment, where a plurality of bit line pairs are used in an array, a sub-set of bit-lines are selected at a time for discharging to prevent current spikes. Each of the bit lines is discharged only every specific number of memory cycles since significant subthreshold leakage takes a relatively long period of time to overcharge a bit line. For example, discharge may take place every 512 cycles.

BRIEF DESCRIPTION OF THE DRAWINGS

FIG. 1 is an electrical schematic showing complementary bit lines in a memory array coupled to a sense amplifier along with the discharging circuits of the present invention.

FIG. 2 is a graph illustrating the deterioration in gain that results from subthreshold leakage.

FIG. 3 is a graph illustrating the loss in performance in a sense amplifier associated with subthreshold leakage.

FIG. 4 is a timing diagram used to illustrate the discharging control signal (DSCH) used with the present invention.

FIG. 5 is a block diagram illustrating the circuit used for generating the control signal of FIG. 4.

DETAILED DESCRIPTION OF THE PRESENT INVENTION

A circuit is described for controllably discharging bit lines in a memory array to compensate for the effects of subthreshold leakage. In the following description, numerous specific details are set forth including specific timing, in order to provide a thorough understanding of the present invention. It will be apparent that the present invention may be practiced without these specific details. In other instances, well-known circuits, such as memory cells and sense amplifiers are not described in detail in order not to unnecessarily obscure the present invention.

Referring first to FIG. 1, a portion of a memory array is illustrated which includes a plurality of memory cells 12 which are selectively coupled to the complementary bit lines 10 and 11. The memory cells, by way of example, may be ordinary static memory cells using bistable circuits (flip-flops). The word lines and other circuits used to selectively couple the cells to the bit lines are not illustrated.

The bit lines 10 and 11 are coupled to a sense amplifier 17. When the sense amplifier is selected and enabled, it provides a differential output which, for example, is coupled to a second stage of sensing as is well-known in the prior art. The bit lines 10 and 11 are also coupled through pull-up transistors 14 and 16, respectively, to $V_{cc}$. Precharging of the lines 10 and 11 occurs when the precharge signal (line 19) is high which causes the transistors 14 and 16 to conduct. These n-channel field effect transistors are typically relatively large when compared to other transistors in the memory array since the bit lines often have considerable capacitance.

As previously discussed, the bit lines 10 and 11 can remain fully charged for a considerable length of time. The precharge signal coupled to line 19 remains in its high state assuring that transistors 14 and 16 conduct until an active memory cycle occurs. The lines 10 and 11 nominally remain at a potential of $V_{cc}$ less the voltage threshold drop associated with the pull-up transistors 14 and 16. However, if one or both of these transistors have subthreshold leakage, the potential on the bit lines can rise above the nominal potential and in fact, can rise to values that are very close to $V_{cc}$.

Referring to FIG. 2, the gain of a sense amplifier such as sense amplifier 17 of FIG. 1 is illustrated versus the nominal potential on the bit lines 10 and 11. The vertical line 30 is the nominal potential, that is, the potential $V_{cc}$ less the threshold drop associated with the pull-up transistors. The sense amplifier is optimized to operate at this nominal potential and has relatively high gain for this potential. The performance of the sense amplifier deteriorates as the bit lines rise in potential to $V_{cc}$. This is shown to the left of line 30 in FIG. 2. Note the steep drop in potential as the bit line rises towards $V_{cc}$. Thus, the sense amplifier may have less gain due to the subthreshold leakage.

FIG. 3 illustrates the output potential versus time for a sense amplifier such as the sense amplifier 17. The waveform 40 represents the output for a bit line charged above the nominal potential through subthreshold leakage; waveform 41 represents the output with the improvement of the present invention. Note that in FIG. 3, the waveform 41 drops more quickly than for waveform 40, that is, the data on the bit line is sensed more quickly with the improvement of the present invention. The difference is shown by distance 42; this distance illustrates the deteriorated performance associated with subthreshold leakage.

With the present invention, the bit lines 10 and 11 are periodically discharged. The discharging is controlled, specifically the discharging is limited, so that approximately only the charge which causes the bit lines to rise above the nominal potential is removed. This is done through the discharging circuits shown in FIG. 1. The series n-channel transistors 20 and 21 are connected in series between the bit line 10 and a reference potential, specifically, ground. Similarly, the n-channel transistors 22 and 23 are connected in series between the bit line 11 and ground. Each of these pairs of transistors comprises a discharging circuit. The gates of the transistors 20 and 22 are coupled to receive the precharging signal on line 19. The gates of the n-channel transistors 21 and 23 are coupled to receive the discharging signal (DSCH) on line 25.

As can be seen from FIG. 1, when the discharging signal on line 25 and the precharging signal on line 19 are both in their high state, transistors 20, 21, 22 and 23 conduct. As transistors 20 and 21 conduct, charge is drained from bit line 10 to ground. Similarly, when transistors 22 and 23 conduct, charge is drained from bit line 11 to ground. The transistors 20, 21, 22 and 23 are relatively small when compared to transistors 14 and 16. Thus, transistors 14, 20 and 21 may be looked at as a voltage divider with substantially more voltage drop across transistors 20 and 21 since they are significantly smaller in size than transistor 14. The relative sizes of transistors 14, 20 and 21 is selected so that when transistors 14, 20 and 21 conduct, line 10 will be approximately at its nominal precharged potential that is a voltage threshold below $V_{cc}$. Similarly, bit line 11 is brought to the nominal precharged potential through the transistors 16, 22 and 23.

Referring now to FIG. 4, a memory cycle 50 is illustrated. Memory cycles occur under control of a clocking signal as is typically the case. During an inactive memory cycle, that is when a particular column in the array is not selected, the precharge signal 51 remains high throughout the entire memory cycle. That is, there is no waveform 52 representing the read/write access to a cell. Also, as previously mentioned, the inactive memory cycles may constitute the majority of cycle hence considerable periods of time may lapse between reading or writing to cells along given complementary bit lines.

During an active memory cycle, precharging occurs during the first portion of a cycle as shown by waveform 51 followed by reading or writing shown in the second half of the memory cycle by waveform 52.

Periodically, the DSCH signal is high as shown by waveform 53. It is brought high for a given set of complementary bit lines, in the currently preferred embodiment, once every 512 memory cycles. Importantly, with the present invention, the DSCH signal need not be synchronized with memory access signals, that is, DSCH can be high during either an active or inactive memory cycle. When it is high during an active memory cycle such as shown in FIG. 4, reading and/or writing can occur in the second half of the memory cycle without additional precharging. The reason for this is that the discharging circuit of FIG. 1 does not discharge lines 10 or 11 below the nominal potential. Therefore, even though the DSCH signal remains high during part or all of an active memory cycle, data may be read from cells along the bit lines selected for discharging. During the actual sending of data, since the PC signal is low no discharging occurs that may affect sensing.

In a typical memory array, there are a plurality of complementary bit line pairs such as lines 10 and 11. A single DSCH signal may be used to discharge excess potential from all these bit lines at one time. However, if this is done, there may be current spikes or other noise caused by all the bit lines being discharged. In the currently preferred embodiment, there is a separate discharge circuit for each module. The array is divided to 'n' equal modules. Each module receives a different DSCH signal. The generation of these different DSCH signals is shown in FIG. 5.

A clock signal 60 is coupled to a counter 61. This clock signal 60 (PH1) occurs in the currently preferred embodiment once each memory cycle. After every 512 cycles of the PH1 signal an output occurs from counter 61. This counter is coupled to the flip-flop 62, the flip-flop 62 is set high for one cycle of the PH1 clock every 512 cycles of the PH1 clock. When the flip-flop 62 is set high, the $DSCH_0$ signal is high for one cycle of the PH1 clock. Following this, flip-flop 63 is high for one cycle of PH1 and thus the $DSCH_1$ signal on line 25 is high for one cycle. The output of the flip-flop 63 is rippled through each of the flip-flops to flip-flop 64 so that the $DSCH_n$ signal is high for one clock cycle. There is a one-to-one correspondence for each of the DSCH signals ($DSCH_0 \ldots DSCH_n$) and the modules and their respective discharging circuits. Thus, if there are 8 modules in a memory array, n will equal 7 and there will be 8 consecutive (not overlapping) DSCH signals generated. For sake of illustration, the output of the flip-flop 63, line 25, corresponds to the DSCH signal shown in FIG. 1.

The DSCH signal generating circuit of FIG. 5 assures that the bit-lines in each module are discharged at a different time and thus the current spikes or other noise associated with such discharging is minimized.

The subthreshold leakage is typically small and consequently, the bit lines slowly rise in potential when leakage is present. For this reason, the bit lines can be discharged relatively infrequently when compared to the number of memory cycles. With the counter 61 of FIG. 5, the bit lines for the illustrated example are discharged every 512 memory cycles.

Thus, a circuit has been described for discharging bit lines in a memory array to a nominal (predetermined) potential. This potential is the potential that is ideal for the operation of the sense amplifier connected to the bit lines.

I claim:

1. A method for use in a memory having a bit line which is precharged through an n-channel transistor, for reducing the effects of subthreshold conduction through the n-channel transistor comprising the steps of:

periodically selecting the bit line for discharging asynchronously to memory access; and controlling the discharging so that access to a memory cell connected to the bit line is permitted after the bit line is selected for discharging without a new precharging cycle.

2. The method defined by claim 1 wherein the memory uses a clock signal and the step of periodically selecting comprises the selecting of the bit line for discharging after the occurrence of a predetermined number of cycles of the clock signal.

3. The memory defined by claim 2 having a plurality of bit lines divided into modules and wherein each module is selected during a different one of the cycles for discharging.

4. A method for use in a memory using a plurality of pairs of complementary bit lines which are precharged through n-channel transistors when cells connected to the bit lines are not being accessed, for reducing the effects of subthreshold conduction through the n-channel transistors, comprising the steps of:

periodically selecting each of the pairs of complementary bit lines during a different period for discharging;

controlling the discharging so that read cycles to memory cells connected to the pairs of complementary bit lines are permitted immediately following discharging.

5. In a memory where at least one memory cell is connected to a sense amplifier by a pair of complementary bit lines and where the bit lines are precharged through a pair of n-channel transistors, an improvement comprising:

a first discharging circuit comprising a first and a second transistor coupled in series between one of the bit lines and a reference potential, one of the first and second transistors being smaller in size than either one of the pair of n-channel transistors;

a second discharging circuit comprising a third and a fourth transistor coupled in series between the other of the bit lines and the reference potential, one of the third and fourth transistors being smaller in size than either one of the pair of n-channel transistors;

the first and third transistors being coupled to receive a signal for controlling the precharging of the bit lines;

the second and fourth transistors being coupled to receive a control signal which periodically causes the second and fourth transistors to conduct.

6. The improvement defined by claim 5 wherein the periods when the second and fourth transistors conduct is substantially less than the period on non-conduction.

* * * * *

UNITED STATES PATENT AND TRADEMARK OFFICE
CERTIFICATE OF CORRECTION

PATENT NO.    :  5,517,452
DATED         :  May 14, 1996
INVENTOR(S)   :  Mehalal It is certified that error appears in the above-identified patent and that said Letters Patent is hereby corrected as shown below:

On the title page, in line 2 of the Abstract in section [57], delete "effect" and substitute --effects--.

In column 2, at line 13, delete "army" and substitute --array--.

Signed and Sealed this

Thirty-first Day of December, 1996

Attest:

BRUCE LEHMAN

Attesting Officer    Commissioner of Patents and Trademarks